US012641747B2

(12) United States Patent
Sen et al.

(10) Patent No.: US 12,641,747 B2
(45) Date of Patent: May 26, 2026

(54) METHODS AND APPARATUS TO COOL ELECTRONIC DEVICES

(71) Applicant: Intel Corporation, Santa Clara, CA (US)

(72) Inventors: Arnab Sen, Bangalore (IN); Samarth Alva, Bangalore (IN); Jeff Ku, Taipei City (TW)

(73) Assignee: Intel Corporation, Santa Clara, CA (US)

( * ) Notice: Subject to any disclaimer, the term of this patent is extended or adjusted under 35 U.S.C. 154(b) by 37 days.

(21) Appl. No.: 17/848,583

(22) Filed: Jun. 24, 2022

(65) Prior Publication Data

US 2022/0322569 A1     Oct. 6, 2022

(51) Int. Cl.
H05K 7/20          (2006.01)

(52) U.S. Cl.
CPC ......... H05K 7/20172 (2013.01); H05K 7/202 (2013.01); H05K 7/206 (2013.01)

(58) Field of Classification Search
CPC .... H05K 7/20172; H05K 7/202; H05K 7/206; H05K 7/20136; G06F 1/203
See application file for complete search history.

(56) References Cited

U.S. PATENT DOCUMENTS 5,687,079 A * 11/1997 Bauer ..................... G06F 1/325
                                                       361/695
11,452,232 B2 * 9/2022 Wong ..................... G06F 1/203

2022/0229477 A1 * 7/2022 Chen ..................... G06F 1/203
2022/0350378 A1 * 11/2022 Grossmann ........ H05K 7/20172
2022/0350382 A1 * 11/2022 Grossmann ............. G06F 1/206
2022/0377933 A1 * 11/2022 North ................. H05K 7/20145
2023/0328930 A1 * 10/2023 Lin .................... H05K 7/20409
                                                       361/697

FOREIGN PATENT DOCUMENTS

TW          M619677 U   * 11/2021
TW          M620617 U     12/2021

OTHER PUBLICATIONS

TW M619677 U Translation (Year: 2021).*
NGO, "Alienware x17 R1 RTX 3080 laptop review: A new beginning," NotebookCheck, Sep. 25, 2021, [https://www.notebookcheck.net/Alienware-x17-R1-RTX-3080-laptop-review-A-new-beginning.563108.0.html] retrieved on Sep. 21, 2022, 37 pages.

* cited by examiner

*Primary Examiner* — Jayprakash N Gandhi
*Assistant Examiner* — Matthew Sinclair Muir
(74) *Attorney, Agent, or Firm* — Hanley, Flight & Zimmerman, LLC

(57)          ABSTRACT

Apparatus, systems, and methods are disclosed for cooling an electronic device. An example electronic device includes a chassis, a first fan including a first outlet and a second outlet, and a second fan having a third outlet and a fourth outlet. In the example electronic device, the first fan is to exhaust air through the first outlet and the second fan is to exhaust air through the third outlet to create a positive pressure in the chassis. The first fan is to exhaust air through the second outlet to an exterior of the chassis, and the second fan is to exhaust air through the fourth outlet to an exterior of the chassis.

21 Claims, 6 Drawing Sheets

METHODS AND APPARATUS TO COOL ELECTRONIC DEVICES

FIELD OF THE DISCLOSURE

This disclosure relates generally to electronic devices and, more particularly, to methods and apparatus to cool electronic devices.

BACKGROUND

Electronic devices include heat generating components. Thermal management techniques are used to reduce the temperature of the skin of the electronic devices.

BRIEF DESCRIPTION OF THE DRAWINGS

In general, the same reference numbers will be used throughout the drawing(s) and accompanying written description to refer to the same or like parts. The figures are not to scale.

DETAILED DESCRIPTION

Figure 1:
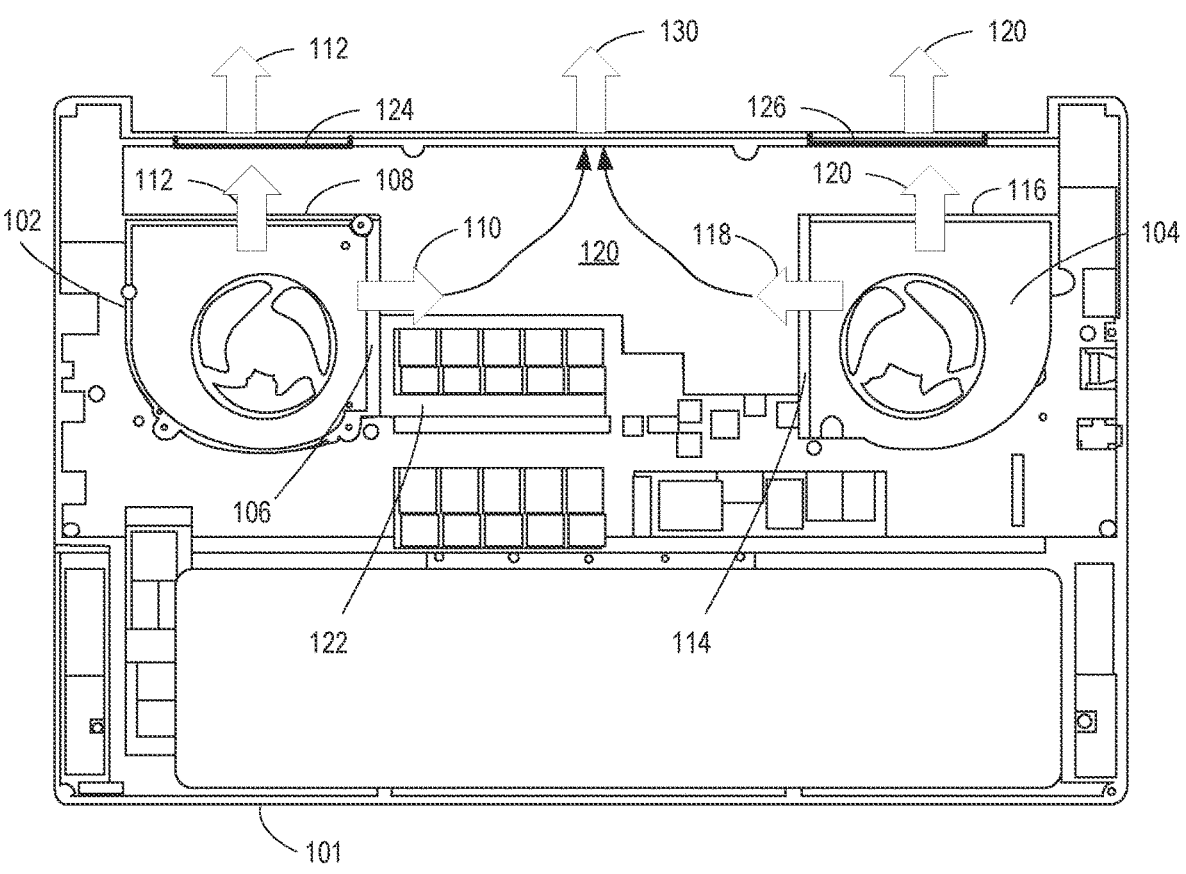
FIG. 1 is a schematic illustration of an example cooling system for an example electronic device having an example configuration.

Evacuative flow architecture is an example thermal management technique used to cool skin temperature of electronic devices. Evacuative flow architecture includes fans that generate a sub-ambient pressure zone inside a chassis of the electronic device by creating a suction and then pushing the air through heat exchangers. The air passing through the heat exchangers cools heat pipe(s) and/or a vapor chamber, in turn reducing the skin temperatures as well as junction temperatures of circuitry components of the electronic device. Junction temperature, or transistor junction temperature, is typically the highest operating temperature of a semiconductor in an electronic device.

Another example thermal management technique includes a hyperbaric flow architecture used to cool the skin and other components of an electronic device. An example hyperbaric flow architecture includes one or more fans creating a suction of air into the electronic device, which creates a positively pressurized zone. The positively pressurized zone may be known as a hyperbaric chamber. The positive pressure pushes cooling air through a region of a PCB (e.g., the core region) and then through a heat exchanger such as, for example, a heat exchanger located at a peripheral edge of the electronic device.

Another example thermal management technique includes a combination of evacuative flow architecture and hyperbaric flow architecture. In this example, one fan is used to create a suction to advance cooling air through the electronic device. A second fan is used to create a super-ambient pressure (i.e., a positive pressure) to push cooling air through the electronic device. In some examples, this combination technique is asymmetric such that one of the fans cools a larger portion of the electronic device. For example, the fan used to create the super-ambient pressure may be used to push cooling air over a larger area of the electronic device.

Yet another example thermal management technique includes one or more dual outlet fans that are oriented to create a positively pressurized area in the core regions of the electronic device and evacuative flow through a heat exchanger. This example architecture is a hybrid hyperbaric flow architecture. The one or more dual outlet fans can be used to create both hyperbaric and evacuative flow cooling.

Throughout this disclosure, hyperbaric pressure, positive pressure, and super-ambient pressure may be used interchangeably to mean a pressure that is greater than the ambient pressure of the environment surrounding the electronic device. Negative pressure and sub-ambient pressure may be used interchangeably to mean a pressure that is lower than the ambient pressure of the environment surrounding the electronic device.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

FIG. 1 is a schematic illustration of an example cooling system for an example electronic device 100. In the illustrated example, the electronic device 100 is a notebook or laptop computer. The examples disclosed herein may be implemented in other types of electronic devices. FIG. 1 shows a partial cross-sectional view of a lower or base panel including an example chassis 101. The electronic device 100 includes an example first dual outlet fan 102 and an example second dual outlet fan 104.

The first dual outlet fan 102 includes an example first outlet 106 and an example second outlet 108. The first dual outlet fan 102 exhausts an example first flow or stream of air 110 from the first outlet 106. The first dual outlet fan 102 exhausts an example second flow or stream of air 112 from the second outlet 108. The second dual outlet fan 104 includes an example third outlet 114 and an example fourth outlet 116. The second dual outlet fan 104 exhausts an example third flow or stream of air 118 from the third outlet 114. The second dual outlet fan 104 exhausts an example fourth flow or stream of air 120 from the fourth outlet 116.

The first dual outlet fan 102 is positioned or oriented inwards such that the first outlet 106 is directed towards example PCB components 122 including, for example, heat generating components such as, for example, a CPU, a GPU, other processing circuitry and/or other electronic components. The second outlet 108 is directed towards an example first heat sink or exchanger 124. The second dual outlet fan 104 is positioned or oriented inwards such that the third outlet 114 is directed towards the PCB components 122. The fourth outlet 116 is directed towards an example second heat sink or exchanger 126. In some examples, there may be a different number of heat exchangers such as, for example, one, three, etc. In some examples with one heat exchanger, both the first dual outlet fan 102 and the second dual outlet fan 104 exhaust air over the same heat exchanger. In some examples, the second flow of air 112 exhausts from the second outlet 108 directly to an exterior of the chassis 101, and the fourth flow of air 120 exhausts from the fourth outlet 116 directly to the exterior of the chassis 101.

The inward positioning of both the first dual outlet fan 102 and the second dual outlet fan 104 creates a positive pressure in the core area (e.g., over the PCB components 122). The first dual outlet fan 102 and the second dual outlet fan 104 create super-ambient pressure through the first outlet 106 and the third outlet 114, respectively. Thus, the core area is a region of positive pressure also known as a hyperbaric chamber 128.

In the example of FIG. 1, the first dual outlet fan 102 is to exhaust air through the first outlet 106 in a first direction, and the second dual outlet fan 104 is to exhaust air through the third outlet 114 in a second direction, the second direction opposite the first direction. In the example of FIG. 1, the first direction and the second direction are parallel, aligned, and opposite each other such that the air 110 exhausted from the first outlet 106 and the air 118 exhausted from the third outlet 114 blow toward or into each other.

In the electronic device 100 of FIG. 1, the first dual outlet fan 102 and the second dual outlet fan 104 are separated a distance, and the positive pressure or hyperbaric chamber 128 is created within the distance.

The second flow of air 112 and fourth flow of are 120 are mainly evacuative so that the first dual outlet fan 102 and the second dual outlet fan 104 create sub-ambient pressure through the second outlet 108 and the fourth outlet 116, respectively.

In the example of FIG. 1, the first stream of air 110 is orthogonal to the second stream of air 112, and the third stream of air 118 is orthogonal to the fourth stream of air 120. Also, in the illustrated example of FIG. 1, the first stream of air 110 and the third stream of air 118 combine in the hyperbaric chamber 128 to form an example fifth stream of air 130. The second stream of air 112, fourth stream of air 120, and fifth stream of air 130 are parallel. The fifth stream of air 130 flows to the exterior of the chassis 101. In some examples, the fifth stream of air 130 flows through a heat exchanger.

FIGS. 2A-D are schematic illustrations of an example cooling system for an example electronic device having example alternative configurations. The example configurations of FIGS. 2A-D are example W-board hybrid hyperbaric flow architectures. These examples are referred to as a "W" type architecture because the PCB shape resembles the letter "W."

In the examples of FIGS. 2A-D, the first dual outlet fan 102 has a primary outlet 202 and a secondary outlet 204. The second dual outlet fan also has a primary outlet 206 and a secondary outlet 208. The primary outlets 202, 206 have higher average pressure (P) and flow (Q) characteristics (PQ characteristics) compared to the secondary outlets 204, 208. The PQ characteristics or a PQ curve indicates a correlation between fan air flow rate and static pressure. An air flow rate is the total amount of air passing through the fan per unit of time. Air flow may be measured, for example in cubic feet per minute (CFM), cubic meters per hour (m³/hr), and/or liters per minute (LPM). A maximum air flow rate of a fan occurs when the fan operates in open space without any impedance. The actual air flow through a fan (e.g., the operating point of the fan) varies due to flow impedance from the system or product in which the fan is installed.

In some examples, the primary outlets 202, 206 are larger (e.g., have a greater cross-sectional area) than the secondary outlets 204, 208. This size difference can lead to the different PQ characteristics between the primary outlets 202, 206 and the secondary outlets 204, 208.

Figures 2A, 2B, 2C, 2D:
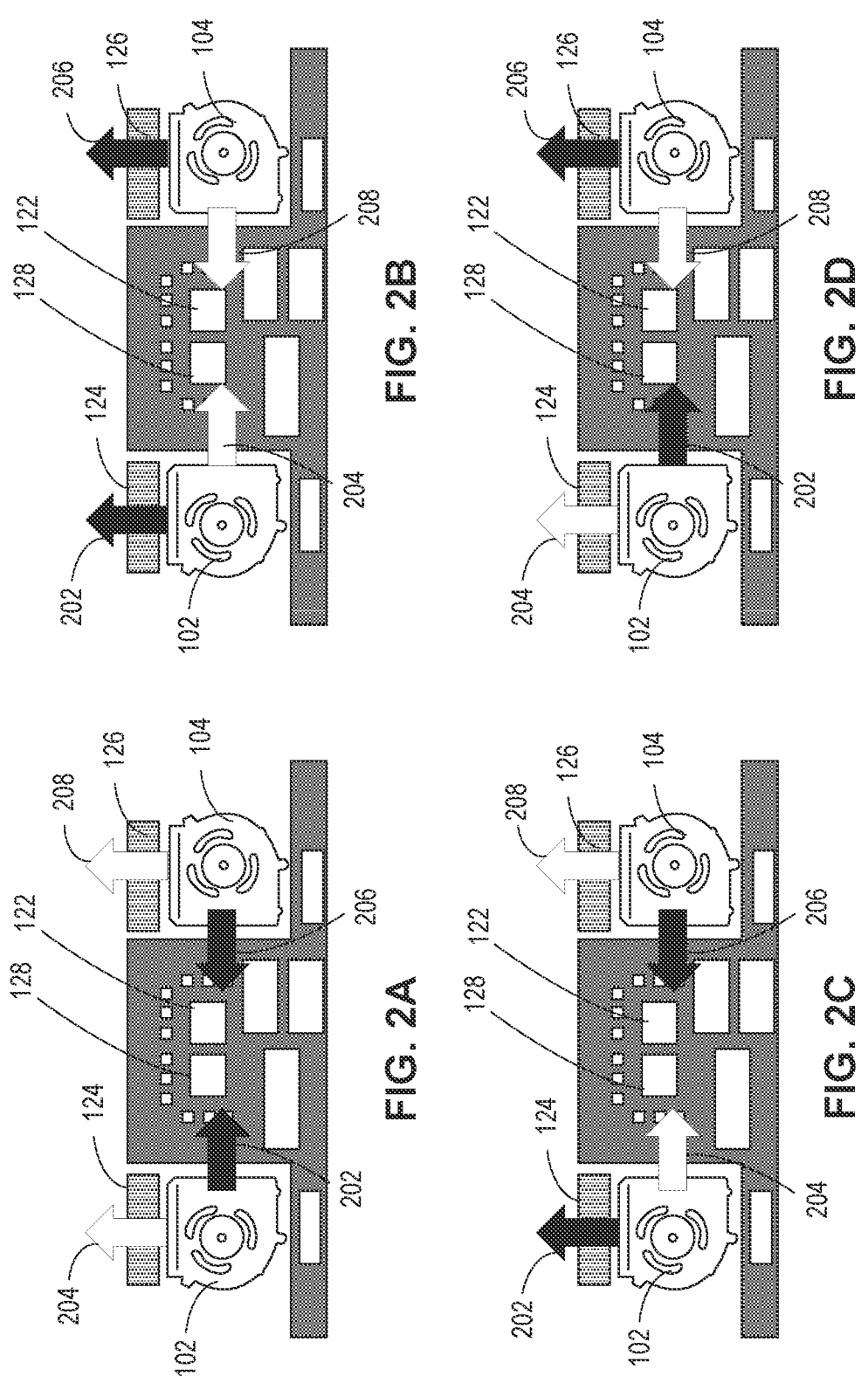
FIGS. 2A-D are schematic illustrations of an example cooling system for an example electronic device having example alternative configurations.

FIG. 2A shows an example in which the primary outlet 202 of the first dual outlet fan 102 and the primary outlet 206 of the second dual outlet fan 104 are directed toward the interior of the chassis 101 of the electronic device 100. The secondary outlet 204 of the first dual outlet fan 102 is directed through the first heat exchanger 124 toward the exterior of the chassis 101. The secondary outlet 208 of the second dual outlet fan 104 is directed toward the exterior of the chassis 101 through the second heat exchanger 126.

FIG. 2B shows an example in which the primary outlet 202 of the first dual outlet fan 102 is directed through the first heat exchanger 124 toward the exterior of the chassis 101. The primary outlet 206 of the second dual outlet fan 104 is directed through the second heat exchanger 126 toward the exterior of the chassis 101. The secondary outlet 204 of the first dual outlet fan 102 and the secondary outlet 208 of the second dual outlet fan 104 are directed toward the interior of the chassis 101.

FIG. 2C shows an example in which the primary outlet 202 of the first dual outlet fan 102 is directed toward the exterior of the chassis 101 through the first heat exchanger 124. The primary outlet 206 of the second dual outlet fan 104 is directed toward the interior of the chassis 101. The secondary outlet 204 of the first dual outlet fan 102 is directed toward the interior of the chassis 101. The secondary outlet 208 of the second dual outlet fan 104 is directed through the second heat exchanger 126 toward the exterior of the chassis 101.

FIG. 2D shows an example in which the primary outlet 202 of the first dual outlet fan 102 is directed toward the interior of the chassis 101. The primary outlet 206 of the second dual outlet fan 104 directed through the second heat exchanger 126 toward the exterior of the chassis 101. The secondary outlet 204 of the first dual outlet fan 102 is directed through the first heat exchanger 124 toward the exterior of the chassis 101. The secondary outlet 208 of the second dual outlet fan 104 is directed through the second heat exchanger 126 toward the exterior of the chassis 101.

Performance differences among these different example combinations shown in FIGS. 2A-D may vary depending on the system design. For example, depending on how the system core components (e.g., the electronic components 122) and the heat exchangers 124, 126 are placed, the impedance characteristics of the electronic device 100 will be different. Because of the different PQ characteristics of the primary outlets 202, 206 and the secondary outlets 206, 208, the different configurations of FIGS. 2A-D will have different thermal management characteristics over the other configurations of FIGS. 2A-D.

In the examples FIGS. 2A-D, the heat exchangers 124, 126 are placed along respective ones of the dual outlet fans 102, 104. In other examples, there may be other heat exchanger configurations including, for example, a center heat exchanger, either connected or separated from the two heat exchangers 124, 126 on two sides.

In the examples FIGS. 2A-D, the hyperbaric chamber 128 is created between the first dual outlet fan 102 and second dual outlet fan 104, whether the dual outlet fans 102, 104 are oriented with the primary outlet 202, 206 or the secondary outlet 204, 208 directed to the center of the chassis 101.

Figure 3:
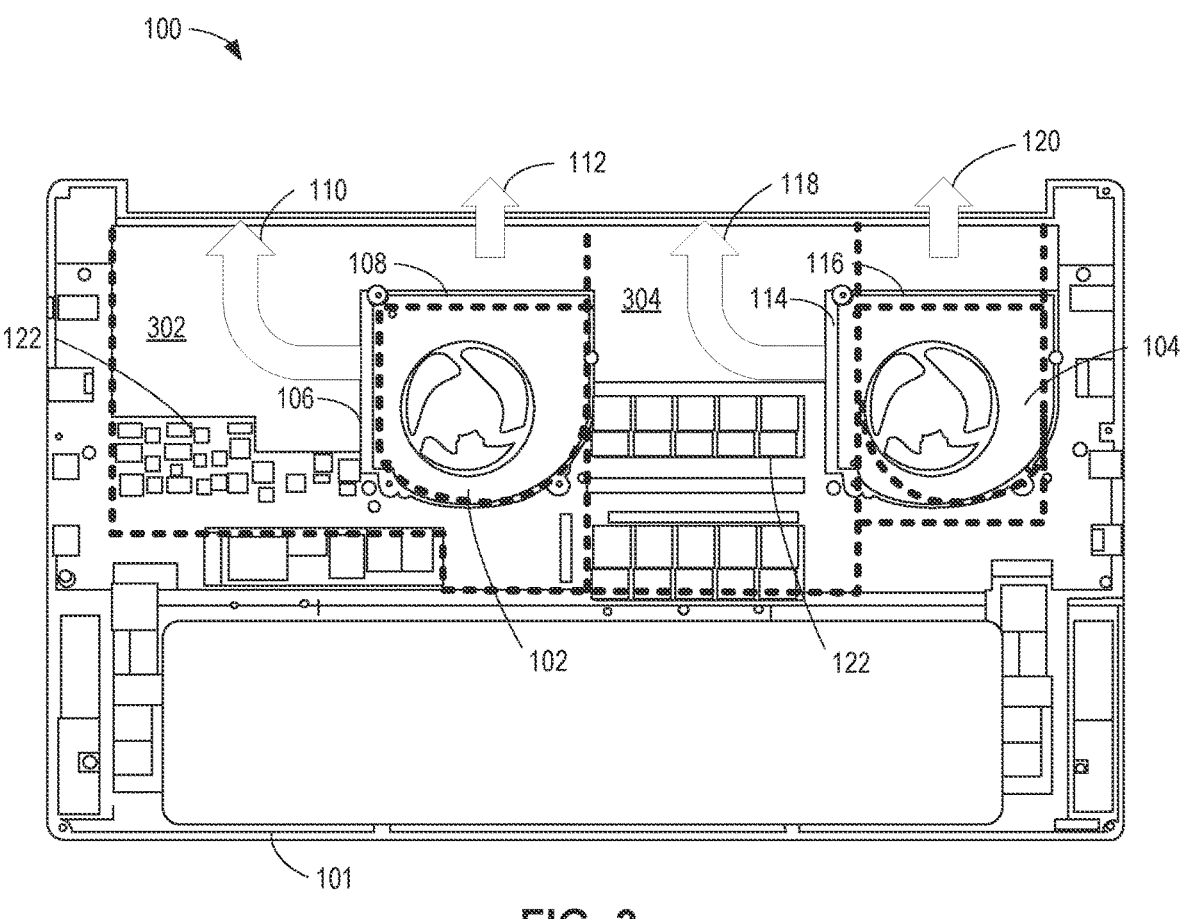
FIG. 3 is a schematic illustration of an example cooling system for an example electronic device having another example configuration.

FIG. 3 is a schematic illustration of an example cooling system for an example electronic device having another example configuration. The example configuration of FIG. 3 is an example E-board hybrid hyperbaric flow architecture. This example is referred to as an "E" type architecture because the PCB shape resembles the letter "E."

In the electronic device 100 of FIG. 3, the first dual outlet fan 102 and the second dual outlet fan 104 are positioned differently than shown in the example of FIG. 1. In this example, the first dual outlet fan 102 has been shifted toward a center of the chassis 101 and oriented or positioned to direct the first stream of air 110 in a direction away from the second dual outlet fan 104.

In this example, the first dual outlet fan 102 is to exhaust air through the first outlet 106 in the first direction 110 to create positive pressure in an example first region 302 of the chassis 101. The second dual outlet fan 106 is to exhaust air through the third outlet 114 in the second direction 118 to create positive pressure in an example second region 304 of the chassis 101. The second direction 118 aligned with and parallel to the first direction 110. In this example, the first direction 110 and the second direction 118 both correspond to air flow in the same direction. The first dual outlet fan 102 exhausts the first stream of air 110 away from the second dual outlet fan 106, and the second dual outlet fan 104 exhausts the third stream of air 118 toward the first dual outlet fan 102.

In the example of FIG. 3, the second region 304 is adjacent to the first region 302. Specifically, the first dual outlet fan 102 is to create positive pressure in the first region 302 of the chassis 101 on a first side of the first dual outlet fan 102. The second dual outlet fan 106 is to create positive pressure in the second region 304 of the chassis 101, where the second region 304 is on a second side of the first dual outlet fan 102 between the first dual outlet fan 102 and the second dual outlet fan 106. The first region 302 and the second region 304 are separated by the first dual outlet fan 102.

In the example electronic device 100 of FIG. 3, the electronic components 122 (e.g., the CPU and GPU) are spaced further apart than in the example of FIG. 1. When the CPU and GPU are space further apart, the overall spread of heat load inside the chassis 101 is improved, which leads to reduced skin temperature.

One or more of the first stream of air 110, the second stream of air 112, the third stream of air 118, and/or the fourth stream of air 120 may flow to the exterior of the chassis 101 via one or more heat exchangers such as, for example, the heat exchangers 124, 126 of FIG. 1. An example heat exchanger can run throughout the width of a vapor chamber and/or heat pipe along the edge of the chassis 101 (e.g., the top edge in the orientation of FIG. 3). Such an example heat exchanger can further improve the thermal performance of the cooling system.

Because the first dual outlet fan 102 and the second dual outlet fan 104 are not directing airflow into each other, there is less air flow impedance. In addition, the first dual outlet fan 102 can operate at a first operating point, and the second dual outlet fan 104 can operate a second operating point different than the first operating point. Fans operating at different operating points have different PQ characteristics. When the first dual outlet fan 102 and the second dual outlet fan 104 operate at separate operating points, there is little to no risk of one fan overpowering the other. When one fan overpowers another fan, impedance is raised for the other fan (i.e., the overpowered fan), which reduces overall air flow.

Also, in the example of FIG. 3, due to the positioning of the first dual outlet fan 102 and the second dual outlet fan 104, the trace length from input/output port to either the CPU and/or the GPU can be significantly reduced because the CPU and/or GPU is positioned closer to an edge of the chassis 101. In addition, separate clockwise and counter-clockwise fans are not needed to implement the first dual outlet fan 102 and the second dual outlet fan 104.

Figure 4:
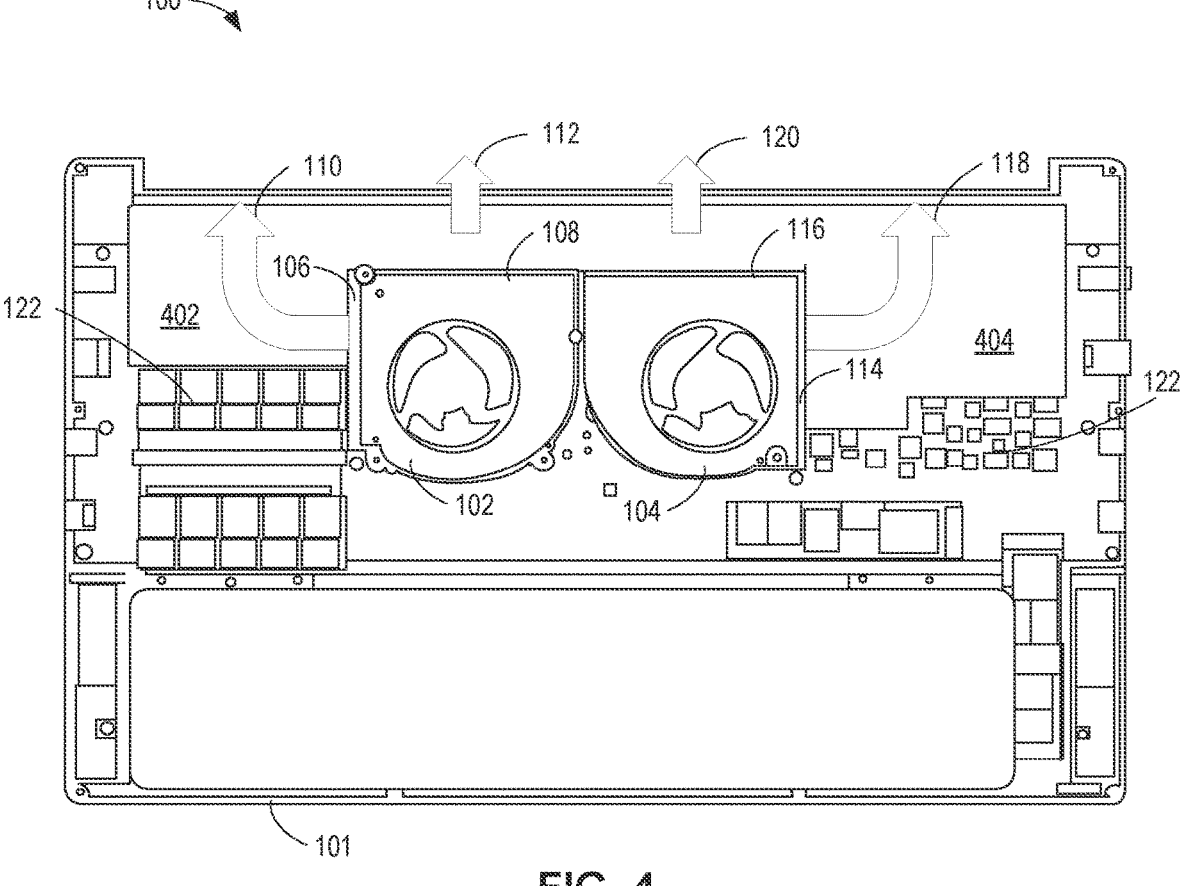
FIG. 4 is a schematic illustration of an example cooling system for an example electronic device having another example configuration.

FIG. 4 is a schematic illustration of an example cooling system for an example electronic device having another example configuration. The example configuration of FIG. 4 is an example U-board hybrid hyperbaric flow architecture. This example is referred to as an "U" type architecture because the PCB shape resembles the letter "U."

In the electronic device 100 of FIG. 4, the first dual outlet fan 102 and the second dual outlet fan 104 are positioned differently than shown in the example of FIG. 1. In this example, the second dual outlet fan 104 has been shifted more toward a center of the chassis 101 and oriented or positioned to direct the third stream of air 118 in a direction away from the first dual outlet fan 102.

In this example, the first dual outlet fan 102 is to exhaust air through the first outlet 106 in the first direction 110 to create positive pressure in an example first region 402 of the chassis 101. The second dual outlet fan 106 is to exhaust air through the third outlet 114 in the second direction 118 to create positive pressure in an example second region 404 of the chassis 101. The second direction 118 aligned with and parallel to the first direction 110. In this example, the first direction 110 and the second direction 118 correspond to air flow in opposite directions. The first dual outlet fan 102 exhausts the first stream of air 110 away from the second dual outlet fan 106, and the second dual outlet fan 104 exhausts the third stream of air 118 away from the first dual outlet fan 102.

In the example of FIG. 4, the first dual outlet fan 102 is to create positive pressure in the first region 402 of the chassis 101 on a first side of the first dual outlet fan 102. A first side of the second dual outlet fan 104 is adjacent a second side of the first dual outlet fan 102. The second dual outlet fan 106 is to create positive pressure in the second region 404 of the chassis 101. The second region 404 is on a second side of the second dual outlet fan 104. Thus, in this example, the first region 402 and the second region 404 are separated by the first dual outlet fan 102 and the second dual outlet fan 104.

In the example electronic device 100 of FIG. 4, electronic components 122 (e.g., the CPU and GPU) are physically spaced further apart than in prior examples. Thus, the overall spread of heat load inside the chassis 101 is improved, which leads to reduced skin temperature.

One or more of the first stream of air 110, the second stream of air 112, the third stream of air 118, and/or the fourth stream of air 120 may flow to the exterior of the chassis 101 via one or more heat exchangers such as, for example, the heat exchangers 124, 126 of FIG. 1. An example heat exchanger can extend through the width of a vapor chamber and/or heat pipe along the edge of the chassis 101 (e.g., the top edge in the orientation of FIG. 4). Such an example heat exchanger can further improve the thermal performance of the cooling system.

As with the example of FIG. 3, because the first dual outlet fan 102 and the second dual outlet fan 104 are not blowing into each other, there is less air flow impedance. In this example, the first dual outlet fan 102 can operate at a first operating point, and the second dual outlet fan 104 can operate a second operating point different than the first operating point. Thus, as with the example of FIG. 3, there is little to no risk of the first dual outlet fan 102 and/or the second dual outlet fan 104 overpowering the other.

Also, in the example of FIG. 4, due to the positioning of the first dual outlet fan 102 and the second dual outlet fan 104, the trace length from input/output port to either the CPU and/or the GPU can be significantly reduced because the electronic components 122 are positioned closer to an edge of the chassis 101 with both the first dual outlet fan 102 and the second dual outlet fan 104 positioned in a center of the chassis 101. In addition, separate clockwise and coun-terclockwise fans are not needed to implement the first dual outlet fan 102 and the second dual outlet fan 104.

Figure 5A:
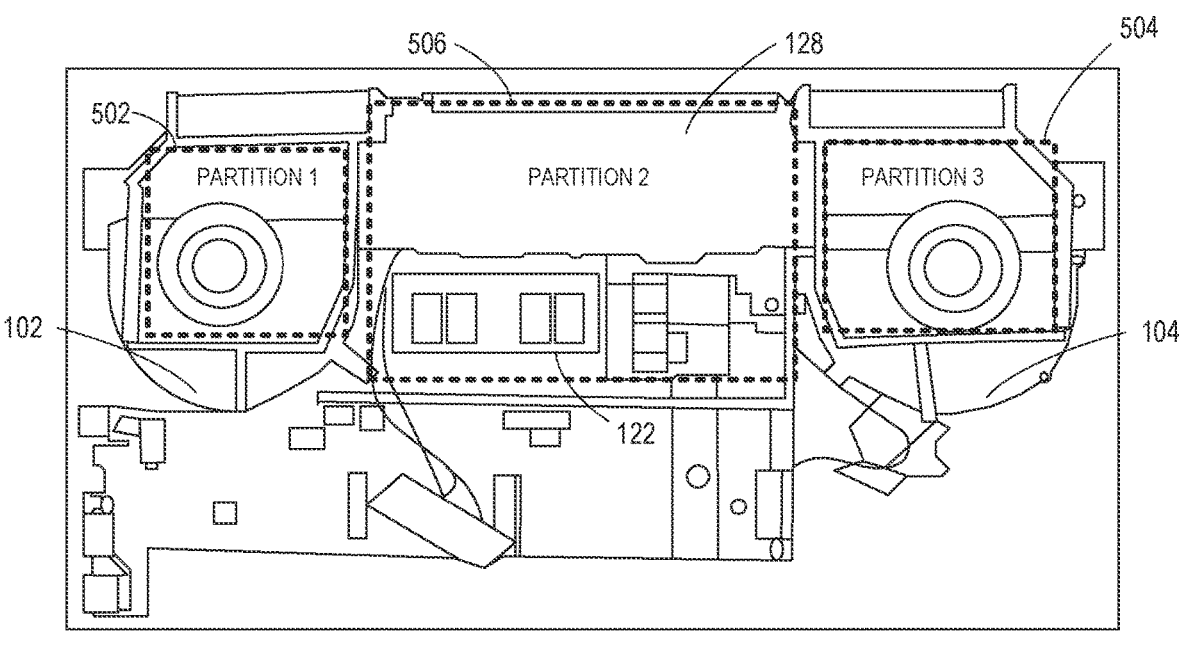
FIG. 5A is a schematic illustration showing example partitions on an example top side of an example printed circuit board (PCB).
Figure 5B:
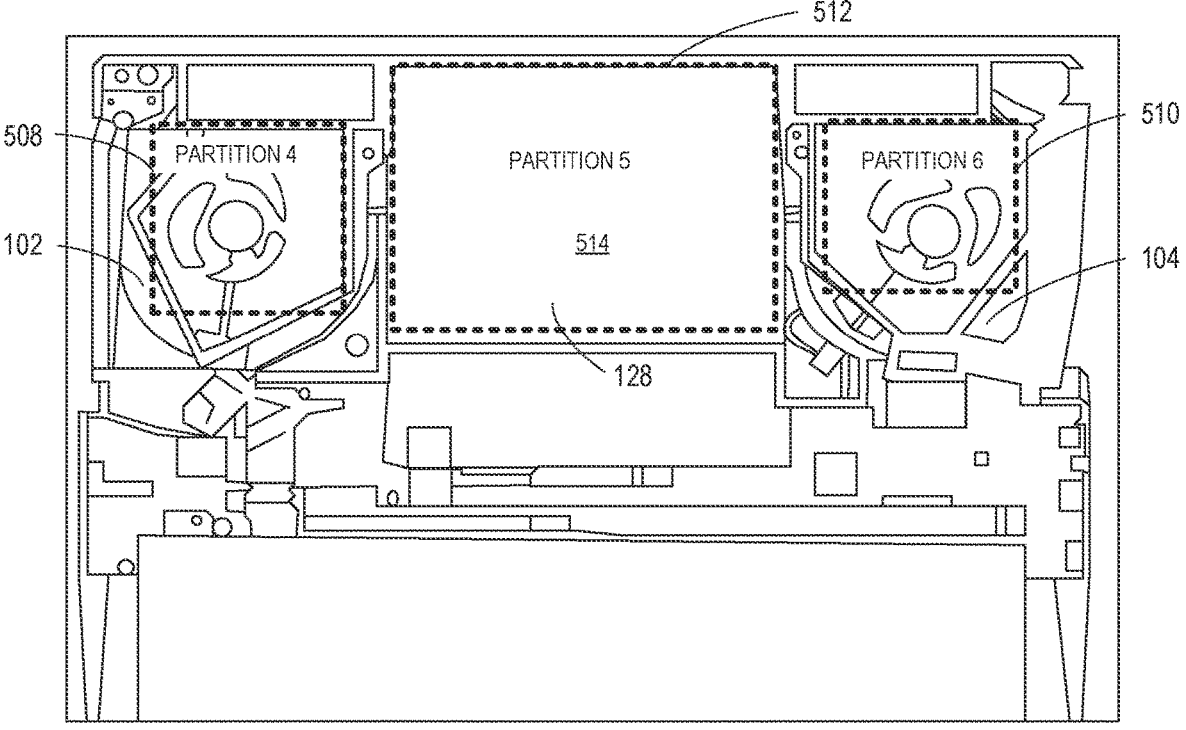
FIG. 5B. is a schematic illustration showing example partitions on an example bottom side of an example PCB.

FIG. 5A is a schematic illustration showing example partitions on an example top side of an example printed circuit board (PCB). FIG. 5B. is a schematic illustration showing example partitions on an example bottom side of an example PCB. FIG. 5A illustrates an outline of an example first partition 502 on and/or above a first (e.g., top) side of the first dual outlet fan 102, an outline of an example second partition 504 on and/or above a first (e.g., top) side of the second dual outlet fan 104, and an outline of an example third partition 506 on and/or above a first (e.g., top) side of the PCB and one or more of the electronic components 122. FIG. 5b illustrates an outline of an example fourth partition 508 on and/or below a second (e.g., bottom) side of the first dual outlet fan 102, an outline of an example fifth partition 510 on and/or below a second (e.g., bottom) side of the second dual outlet fan 104, and an outline of an example sixth partition 512 on and/or below a second (e.g., bottom) side the PCB and one or more of the electronic components 122.

The example partitions 502, 504, 506, 508, 510, 512 may be made of sealing materials including, for example, gas-kets, sponges, plastic framing, rubber, and/or other materials and/or combinations of materials. The partitions 502, 504, 506, 508, 510, 512 are used to create chambers around the first dual outlet fan 102, the second dual outlet fan 104, and at least a portion of the electronic components 122. Together, the first dual outlet fan 102, the second dual outlet fan 104, and the partitions 502, 504, 506, 508, 510, 512 form the hyperbaric chamber 128.

In some examples, a partition (e.g., the sixth partition 512) includes an example cover 514. In some examples, the cover 514 includes stamped sheet metal, a metal foil, a graphite spreader, polyethylene terephthalate, and/or mylar. Other details related to partitions, frame creating partitions, and covers are disclosed in U.S. patent application Ser. No. 17/848,664, which is hereby incorporated by reference in its entirety.

In some examples, the electronic device includes means for creating a positive pressure. For example, the means for creating the positive pressure may be implemented by the first dual outlet fan 102, the second dual outlet fan 104, one or more of the partitions 502, 504, 506, 508, 510, 512, and/or other structure disclosed herein. In some examples, the electronic device includes means for creating a negative pressure. For example, the means for creating the negative pressure may be implemented by the first dual outlet fan 102, the second dual outlet fan 104, and/or other structure disclosed herein.

From the foregoing, it will be appreciated that example systems, methods, apparatus, and articles of manufacture have been disclosed that cool electronic devices. In particular, examples disclosed herein cool the skin (e.g., outer covers) of electronic devices. Examples disclosed herein include hybrid hyperbaric architectures that combine the benefits of evacuative and hyperbaric architectures without suffering from low flow through a limited number of small vents and high air flow impedance complications of conventional systems. Examples disclosed herein provide additional pathways for the air to exit the electronic device, which reduces the overall system/device impedance. For example, in some examples, there are two parallel paths for the air to travel to ambient from inside the device. The lower impedance results in higher air flow throughout the device.

Examples disclosed herein improve thermal performance. The improved thermal performance results in a lower temperature of the skin and other components of the example electronic device (e.g., a keyboard), which improves user experience. In some examples, the skin temperature may be at least 9° C. cooler than conventional designs. In some examples, the cooling capacity is 30% higher than conventional designs.

Examples disclosed herein improve acoustics. For example, there may be a reduction of about 3-6 decibels (dBA) using the dual outlet fans, which can reach thermal targets more efficiently. In some examples, the acoustics benefit is obtained because example dual outlet fans lack side outlets. The side outlets lead to higher noise perception, which is absent in the examples disclosed herein. Additionally, due to the lack of side outlets, the achievements of the thermal management solution disclosed herein is compact and less expensive. Also, in some examples, with the lack of side outlets, the dual outlet fans may operate at higher fan speeds to obtain the same sustained power limit (SPL). Nonetheless, even at a higher fan speed, acoustics for the same rotations per minute (RPM) is reduced. In some examples, the absence of side outlets can reduce acoustics for same RPM by about 2-3 dBA.

In some examples disclosed herein, the dual outlet fans efficiently and effectively cool the electronic device such that the electronic device can include fewer thermal management components. For example, heat pipes, side heat exchangers, and side vents may not be included in the example electronic device.

Figure 6:
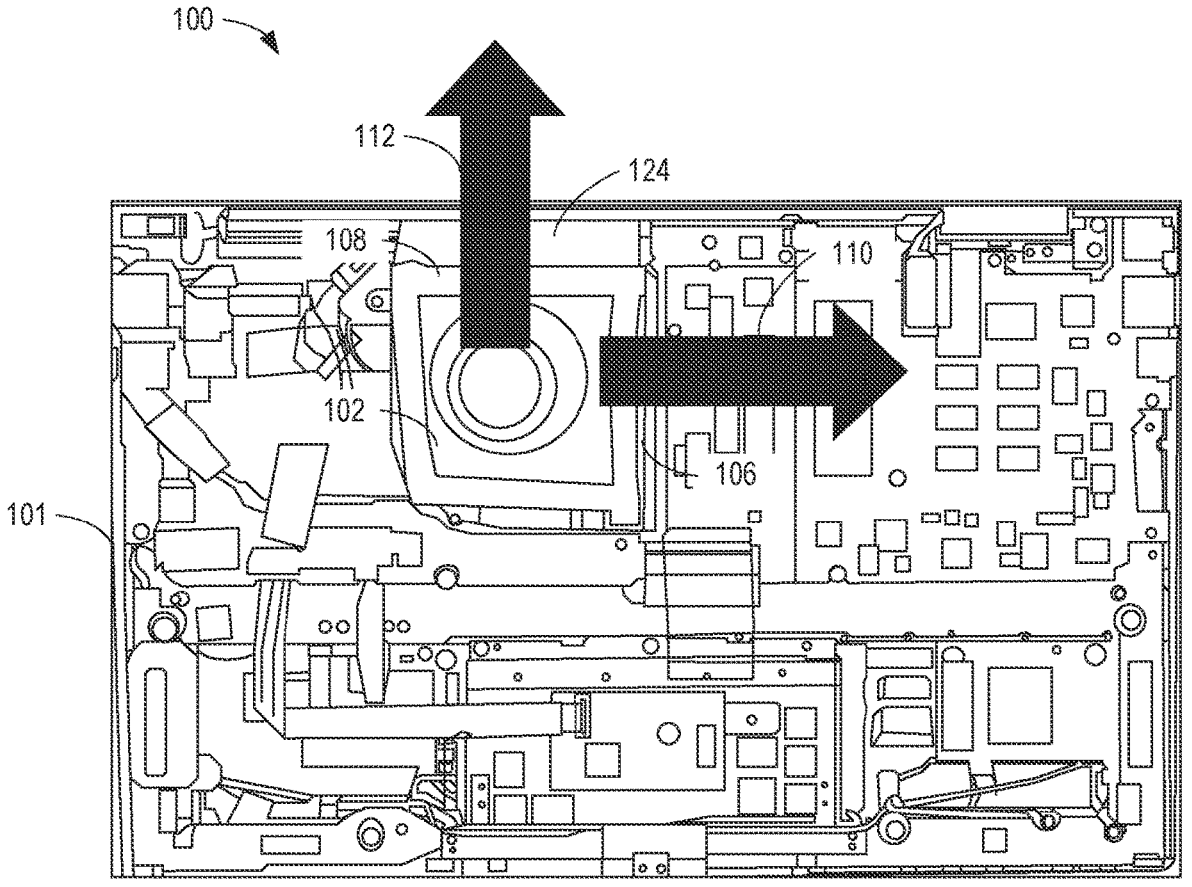
FIG. 6 is a schematic illustration of an example cooling system for an example electronic device having another example configuration.

In some examples, one dual outlet fan may be used to create the positive pressure and the hyperbaric chamber. Thus, in some examples, only one dual outlet fan can be used to achieve the benefits disclosed herein. For example, FIG. 6 shows the example electronic device 100 with the first dual outlet fan 102. The first dual outlet fan 102 exhausts the example first flow or stream of air 110 from the first outlet 106. The first dual outlet fan 102 exhausts the example second flow or stream of air 112 from the second outlet 108. The first stream of air creates positive pressure in the chassis 101. The second stream of air is directed to the exterior of the chassis through the first heat exchanger 124.

Another benefit of examples disclosed herein is the lack of any impact from a blocked inlet. Inlets of an electronic device may be blocked by dust, debris, or another obstruction. In some examples, when the bottom inlets are blocked, the rear center vent becomes an inlet and can draw fresh air and maintain a degree of system functionality. When the bottom inlets are closed, the lower pressure outlet of the dual outlet fan becomes an inlet as the fan still tries to force the air out through the primary outlet.

Example systems, methods, apparatus, and articles of manufacture to cool electronic devices include Example 1, which is an electronic device comprising: a chassis; a first fan including a first outlet and a second outlet; and a second fan having a third outlet and a fourth outlet, wherein the first fan is to exhaust air through the first outlet and the second fan is to exhaust air through the third outlet to create a positive pressure in the chassis, the first fan is to exhaust air through the second outlet to an exterior of the chassis, and the second fan is to exhaust air through the fourth outlet to an exterior of the chassis.

Example 2 includes the electronic device of Example 1, wherein the first fan is to exhaust air through the first outlet in a first direction and the second is to exhaust air through the third outlet in a second direction opposite the first direction.

Example 3 includes the electronic device of Example 2, wherein the second direction is aligned with the first direction such that air exhausted from the first outlet is directed toward air exhausted from the third outlet.

Example 4 includes the electronic device of Examples 2 or 3, wherein the second direction is aligned with the first direction such that air exhausted from the first outlet is directed away from air exhausted from the third outlet, and the first fan is to create the positive pressure in a first region of the chassis, and the second fan is to create the positive pressure in a second region of the chassis, the second region adjacent the first region.

Example 5 includes the electronic device of any of Examples 1-4, wherein the first fan is to exhaust air through the second outlet in a first direction, and the second fan is to exhaust air through the fourth outlet in a second direction parallel to the first direction.

Example 6 includes the electronic device of any of Examples 1-5, further including: a plurality of electronic components, wherein the first fan is to exhaust air through the first outlet and the second fan is to exhaust air through the third outlet over one or more of the electronic components; and a heat exchanger, wherein the first fan is to exhaust air through the second outlet and the second fan is to exhaust air through the fourth outlet through the heat exchanger.

Example 7 includes the electronic device of any of Examples 1-6, wherein the first fan is to operate at a first operating point and the second fan is to operate a second operating point different than the first operating point.

Example 8 includes the electronic device of any of Examples 1-7, wherein the first fan is to exhaust air through the first outlet in a first direction to create the positive pressure in a first region of the chassis, and the second fan is to exhaust air through the third outlet in a second direction to create the positive pressure in a second region of the chassis, the second direction aligned with the first direction, and the second region adjacent the first region.

Example 9 includes the electronic device of any of Examples 1-8, wherein the first fan and the second fan are separated a distance, and the first fan and the second fan are to create the positive pressure within the distance.

Example 10 includes the electronic device of any of Examples 1-9, wherein the first fan is to create the positive pressure in a first region of the chassis on a first side of the first fan, and the second fan is to create the positive pressure in a second region of the chassis, the second region on a second side of the first fan between the first fan and the second fan.

Example 11 includes the electronic device of any of Examples 1-10, wherein the first fan is to create the positive pressure in a first region of the chassis on a first side of the first fan, and the second fan is to create the positive pressure in a second region of the chassis, a first side of the second fan adjacent a second side of the first fan, and the second region on a second side of the second fan.

Example 12 includes an electronic device comprising: a chassis; a first fan to produce a first exhaust stream and a second exhaust stream; and a second fan to produce a third exhaust stream and a fourth exhaust stream, wherein the first exhaust stream and the third exhaust stream create a positive pressure in the chassis, and wherein the second exhaust stream and the fourth exhaust stream include sub-ambient pressure.

Example 13 includes the electronic device of Example 12, wherein the first exhaust steam is in a first direction and the third exhaust stream is a second direction opposite the first direction.

Example 14 includes the electronic device of Example 13, wherein the second direction is aligned with the first direction such that the first exhaust steam and the third exhaust stream flow toward each other.

Example 15 includes the electronic device of Examples 13 or 14, wherein the second direction is aligned with the first direction such that the first exhaust stream and the third exhaust stream flow away from each other, and the first fan is to create the positive pressure in a first region of the chassis, and the second fan is to create the positive pressure in a second region of the chassis, the second region adjacent the first region.

Example 16 includes the electronic device of any of Examples 12-15, wherein the first exhaust stream and the third exhaust stream combine into a fifth stream of air, and wherein the second exhaust stream, the fourth exhaust stream, and the fifth exhaust stream are parallel.

Example 17 includes the electronic device of Example 16, wherein the first exhaust stream and the third exhaust stream are orthogonal to the second exhaust stream and the fourth exhaust stream.

Example 18 includes the electronic device of any of Examples 12-17, wherein the first exhaust stream is to flow over a first region of the chassis and the third exhaust stream is to flow over a second region of the chassis, the second region adjacent the first region.

Example 19 includes the electronic device of Example 18, wherein the first region and the second region are separated by the first fan.

Example 20 includes the electronic device of Example 19, wherein the first region and the second region are separated by the first fan and the second fan.

Example 21 includes a method of manufacturing a cooling apparatus for an electronic device, the method comprising: positioning a first dual outlet fan to produce a positive pressure in the electronic device and a negative pressure to expel air from the electronic device; and positioning a second dual outlet fan to produce a positive pressure in the electronic device and a negative pressure to expel air from the electronic device.

Example 22 includes the method of Example 21, wherein the first dual outlet fan is capable of operating at a first operating point, and the second dual outlet fan is capable of operating at a second operating point, the second operating point different than the first operating point.

Example 23 includes the method of Examples 21 or 22, further including positioning the first dual outlet fan and the positioning the second dual outlet fan to produce the positive pressure in a same region of the electronic device.

Example 24 includes the method of any of Examples 21-23, further including: positioning the first dual outlet fan to expel air toward the second dual outlet fan; and positioning the second dual outlet fan to expel air toward the first dual outlet fan.

Example 25 includes the method of any of Examples 21-24, further including positioning the first dual outlet fan and the positioning the second dual outlet fan directly adjacent to each other.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An electronic device comprising:
a chassis;
a first fan including a first center of rotation, a first outlet facing a first direction, and a second outlet facing a second direction, the second direction of the second outlet orthogonal to the first direction of the first outlet at the first center of rotation;
a first heat sink at an edge of the chassis at the second outlet;
a second fan including a second center of rotation, a third outlet facing a third direction, and a fourth outlet facing a fourth direction, the fourth direction of the fourth outlet orthogonal to the third direction of the third outlet at the second center of rotation;
a second heat sink at the edge of the chassis at the fourth outlet,
the first fan is to exhaust air through the first outlet into the chassis and the second fan is to exhaust air through the third outlet into the chassis, the air from the first outlet and the third outlet to flow from the chassis through a fifth outlet to an exterior of the chassis,
the first fan is to exhaust air through the second outlet to the exterior of the chassis, and
the second fan is to exhaust air through the fourth outlet to an exterior of the chassis;
a first partition around the first fan;
a second partition around the second fan; and
a third partition between the first partition and the second partition, the first partition, the second partition, and the third partition form a hyperbaric chamber in the chassis adjacent the fifth outlet.

2. The electronic device of claim 1, wherein the first fan and the second fan are to create a positive pressure in the chassis.

3. The electronic device of claim 1, wherein the first direction and the third direction are opposite.

4. The electronic device of claim 3, wherein the third direction is aligned with the first direction such that air exhausted from the first outlet is directed toward air exhausted from the third outlet.

5. The electronic device of claim 3, wherein the first fan and the second fan are to create a positive pressure in the chassis, and the third direction is aligned with the first direction such that air exhausted from the first outlet is directed away from air exhausted from the third outlet, and the first fan is to create the positive pressure in a first region of the chassis, and the second fan is to create the positive pressure in a second region of the chassis, the second region adjacent the first region.

6. The electronic device of claim 1, wherein the first fan is to exhaust air through the second outlet in the second direction, and the second fan is to exhaust air through the fourth outlet in the fourth direction parallel to the first direction.

7. The electronic device of claim 1, including:
a plurality of electronic components, the first fan is to exhaust air through the first outlet and the second fan is to exhaust air through the third outlet over one or more of the electronic components; and
a heat exchanger, the first fan is to exhaust air through the second outlet and the second fan is to exhaust air through the fourth outlet through the heat exchanger.

8. The electronic device of claim 1, wherein the first fan is to operate at a first operating point and the second fan is to operate a second operating point different than the first operating point.

9. The electronic device of claim 1, wherein the first fan is to exhaust air through the first outlet in the first direction to create a positive pressure in a first region of the chassis, and the second fan is to exhaust air through the third outlet in the third direction to create a positive pressure in a second region of the chassis, the third direction aligned with the first direction, and the second region adjacent the first region.

10. The electronic device of claim 1, wherein the first fan and the second fan are separated a distance, and the first fan and the second fan are to create positive pressure within the distance.

11. The electronic device of claim 1, wherein the first fan is to create positive pressure in a first region of the chassis on a first side of the first fan, and the second fan is to create positive pressure in a second region of the chassis, the second region on a second side of the first fan between the first fan and the second fan.

12. The electronic device of claim 1, wherein the first fan is to create positive pressure in a first region of the chassis on a first side of the first fan, and the second fan is to create positive pressure in a second region of the chassis, a first side of the second fan adjacent a second side of the first fan, and the second region on a second side of the second fan.

13. The electronic device of claim 1, wherein there are six partitions.

14. An electronic device comprising:
a housing;
a first fan to produce a first exhaust stream and a second exhaust stream, the second exhaust stream orthogonal to the first exhaust stream at a first center of rotation of the first fan;
a second fan to produce a third exhaust stream and a fourth exhaust stream, the fourth exhaust stream orthogonal to the third exhaust stream at a second center of rotation of the second fan,
the second exhaust stream to flow through a first outlet to an exterior of the housing, past a first heat sink at an edge of the housing at the first outlet,
the fourth exhaust stream to flow through a second outlet to the exterior of the housing, past a second heat sink at the edge of the housing at the second outlet, and
the first exhaust stream and the third exhaust stream to flow through the housing to a third outlet to the exterior of the housing without flowing past the first heat sink and the second heat sink at the edge of the housing;
a first partition around the first fan;
a second partition around the second fan; and
a third partition between the first partition and the second partition,
the first partition, the second partition, and the third partition form a hyperbaric chamber in the housing adjacent the third outlet.

15. The electronic device of claim 14, wherein the first exhaust stream and the third exhaust stream create a positive pressure in the housing, and the second exhaust stream and the fourth exhaust stream include sub-ambient pressure.

16. The electronic device of claim 14, wherein the first exhaust steam is in a first direction and the third exhaust stream is a second direction opposite the first direction.

17. The electronic device of claim 16, wherein the second direction is aligned with the first direction such that the first exhaust steam and the third exhaust stream flow toward each other.

18. The electronic device of claim 16, wherein the second direction is aligned with the first direction such that the first exhaust stream and the third exhaust stream flow away from each other, and the first fan is to create the positive pressure in a first region of the chassis, and the second fan is to create the positive pressure in a second region of the chassis, the second region adjacent the first region.

19. The electronic device of claim 14, wherein the first exhaust stream and the third exhaust stream are orthogonal to the second exhaust stream and the fourth exhaust stream.

20. The electronic device of claim 14, wherein the first exhaust stream is to flow over a first region of the chassis and the third exhaust stream is to flow over a second region of the chassis, the second region adjacent the first region, the first region and the second region separated by the first fan.

21. The electronic device of claim 20, wherein the first region and the second region are separated by the first fan and the second fan.

* * * * *